United States Patent [19]

Lee

[11] Patent Number: 5,548,143

[45] Date of Patent: Aug. 20, 1996

[54] METAL OXIDE SEMICONDUCTOR TRANSISTOR AND A METHOD FOR MANUFACTURING THE SAME

[75] Inventor: Yong-hee Lee, Seoul, Rep. of Korea

[73] Assignee: Samsung Electronics Co., Ltd., Suwon, Rep. of Korea

[21] Appl. No.: 567,718

[22] Filed: Dec. 5, 1995

Related U.S. Application Data

[63] Continuation of Ser. No. 235,309, Apr. 29, 1994, abandoned.

[30] Foreign Application Priority Data

Apr. 29, 1993 [KR] Rep. of Korea ......................... 93-7337

[51] Int. Cl.$^6$ .......................... H01L 29/80; H01L 21/265
[52] U.S. Cl. .......................... 257/269; 257/285; 257/345; 257/402; 257/403; 257/404; 257/607; 257/657; 257/919; 437/27; 437/29; 437/44; 437/45; 437/933
[58] Field of Search ..................................... 257/402, 403, 257/404; 437/27, 29, 44, 45, 933

[56] References Cited

U.S. PATENT DOCUMENTS

| 3,891,468 | 6/1975 | Ito et al. | 257/403 |
| 4,021,835 | 5/1977 | Etoh et al. | 257/404 |
| 4,145,233 | 3/1979 | Sefick et al. | 257/402 |

*Primary Examiner*—Edward Wojciechowicz
*Attorney, Agent, or Firm*—Cushman Darby & Cushman, L.L.P.

[57] ABSTRACT

AMOS transistor with enhanced electrical characteristics and a method for manufacturing the same. In the channel region, a first impurity region is provided for adjusting a threshold voltage, a second impurity region is provided which serves as a diffusion barrier, and a third impurity region is provided for preventing a punchthrough. These regions are formed sequentially at subsequently shallower depths in the substrate. The disclosed transistor minimizes short-channel effects and punchthrough without reducing the current driving capability of the device.

16 Claims, 6 Drawing Sheets

DEPTH FROM SURFACE OF SUBSTRATE

METAL OXIDE SEMICONDUCTOR TRANSISTOR AND A METHOD FOR MANUFACTURING THE SAME

This is a continuation of application Ser. No. 08/235,309, filed on Apr. 29, 1994, which was abandoned upon the filing hereof.

BACKGROUND OF THE INVENTION

1. Field of the Invention

The present invention relates to metal oxide semiconductor (MOS) transistors and a method for manufacturing the same, and more particularly, to a MOS transistor having enhanced device characteristics and a method for manufacturing the same.

2. Background of Related Art

In general, a MOS transistor formed on a semiconductor substrate includes a source region and a drain region created by implanting impurity ions of a conductivity type opposite to that of the substrate, a selectively conductive channel region between the source region and the drain region, and a gate electrode formed on the substrate with a gate insulating film imposed between the gate and the substrate.

Conventionally, the gate electrode may be made of an N-type polysilicon, to which a large quantity of phosphorous is added. Alternatively, the gate electrode may be made of a polycide gate structure composed of a high refractory metal silicide and a polysilicon, in which the N-type polysilicon layer is in direct contact with the gate insulating film. Since the work function difference between the N-type substrate and the N-type polysilicon is small, the use of N-type polysilicon increases the negative value of the threshold voltage. Impurity ions may be implanted into the channel region for decreasing the absolute value of the threshold voltage. Such an arrangement results in a very shallow P-N junction, and the resulting device is referred to as a buried channel type P-channel MOS transistor.

As the channel length of a transistor is reduced, certain problems such as decreased threshold voltage, sub-threshold deterioration, and breakdown voltage deterioration may occur which did not occur at longer channel lengths. These short-channel effects are more likely to occur in a buried channel type P-channel MOS transistor than in a surface-channel type.

To reduce the adverse effects of a short channel it has been proposed to form a surface-channel P-channel MOS transistor using P+ polysilicon for the gate electrode material. However, in this arrangement it is difficult to control the threshold voltage of the P-channel MOS transistor, due to the diffusion of boron ions in the P+ polysilicon layer into the channel region. It has also been proposed to form a P-channel MOS transistor similar to the surface-channel type by making the P-N junction depth in the channel region as shallow as possible. According to this proposal, the P-N junction depth of the channel region can be made shallow by implanting $BF_2$, which is heavier than boron. However, this arrangement is susceptible to punchthrough; that is, when the drain-source voltage is high, the drain current is no longer controlled by the gate.

As the integration scale of semiconductor devices is increased, the transistor channel length is reduced and thus, methods to improve the short channel effects and prevent punchthrough of the P-channel MOS transistor are desirable.

To increase the voltage at which punchthrough occurs, it has been proposed to form a punchthrough stopper directly under the channel. According to this method, the impurity concentration under the channel is increased by implanting impurity ions of the same conductivity type as the substrate in a relatively high concentration. Such an arrangement suppresses punchthrough by preventing penetration of the drain electric field into the channel and source regions. The punchthrough stopper may be formed by a method where arsenic ions having a low diffusion coefficient are deeply implanted (IEEE transaction on Electron Device, VOL.ED-31, JULY, 1984, "Device Design for the Submicrometer p-Channel FET with n+ Polysilicon Gate"). This method can suppress surface punchthrough. However, it is difficult to suppress bulk punchthrough. In addition, if arsenic ions are implanted in a high concentration for suppressing bulk punchthrough, the silicon substrate is damaged due to the large mass of arsenic, and leakage current is increased.

Alternatively, a punchthrough stopper may be formed by an antipunchthrough ion implantation method where phosphorous ions are deeply implanted with high concentration (IEDM Technical Digest, 1987, "Submicron Short Channel Effects due to Gate Reoxidation Induced Lateral Interstitial Diffusion"). However, according to this method, phosphorous ions may be diffused into the surface of the channel, making it difficult to control the impurity distribution. Therefore, the majority carriers of the P-type channel region are compensated due to the N-type impurity, and thus, the threshold voltage is increased and the current driving ability of the device is reduced.

SUMMARY OF THE INVENTION

It is an object of the present invention to provide a MOS transistor with enhanced operating characteristics, and a method for manufacturing the same.

A MOS transistor according to the present invention includes a source region and a drain region each of a conductivity opposite that of the substrate, disposed apart from one another and in alignment with a gate electrode; and a channel region including a first impurity region for preventing punch through voltage, a second impurity region which serves as a diffusion-barrier, and a third impurity region for adjusting a threshole voltage. The first, second, and third impurity regions are formed sequentially.

The present invention also provides a method for manufacturing a MOS transistor, in which first, second, and third impurity regions are sequentially formed in the substrate. The first impurity region is formed by implanting ions of the same conductivity type as the semiconductor substrate sufficiently below the region of the substrate where the channel will be formed, such that punchthrough is prevented. The second impurity region is formed by implanting impurity ions having a lower diffusion coefficient than the first impurity ions, and serves as a diffusion-barrier. The third impurity region is formed by implanting third impurity ions of a conductivity type opposite to that of the substrate, and adjusts the threshold voltage.

According to the present invention, a shallow P-N junction can be formed without deteriorating the mobility in the channel region.

BRIEF DESCRIPTION OF THE DRAWINGS

The above objects and other advantages of the present invention will become more apparent by the following detailed description of presently preferred embodiments with reference to the attached drawings in which.

DETAILED DESCRIPTION OF THE INVENTION

Figure 1:
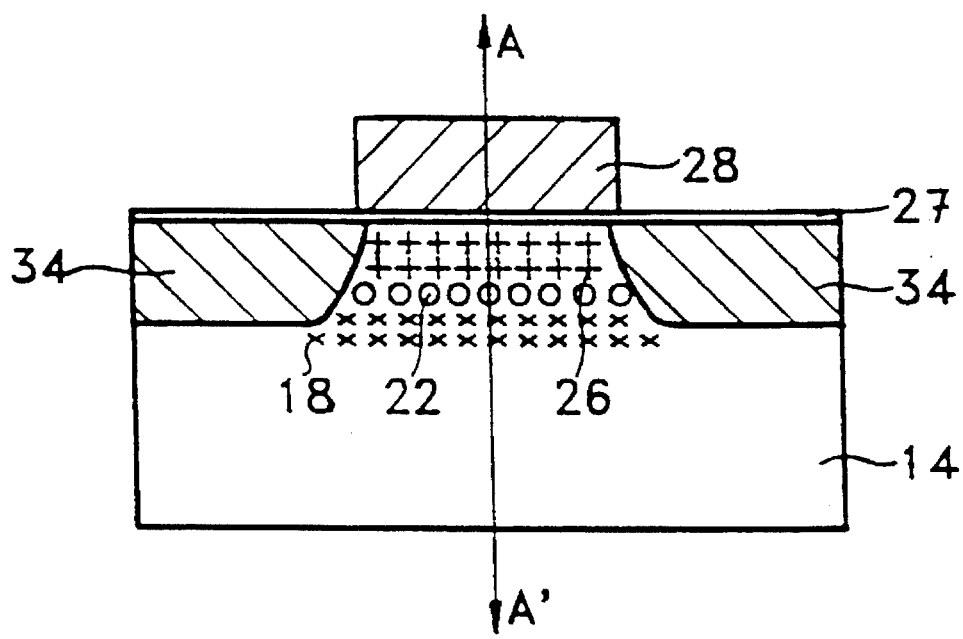
FIG. 1 is a cross-sectional view showing a P-channel MOS transistor according to the present invention.

Referring to FIG. 1, a gate insulating film 27 is formed on an N-type semiconductor substrate or N-well 14, and an N-type gate electrode 28 of a first length is formed on gate insulating film 27. P-type impurity region 26 adjusts the threshold voltage of the transistor, N-type impurity region 22 serves as a diffusion barrier, and N-type impurity region 18 raises substrate (or well) concentration These regions 18, 22, and 26 are sequentially formed in a region of the substrate located below gate electrode 28. A pair of P+type source and drain regions 34 are formed in substrate 14, and are spaced apart from each other in alignment with the length of gate electrode 28.

Figure 2:
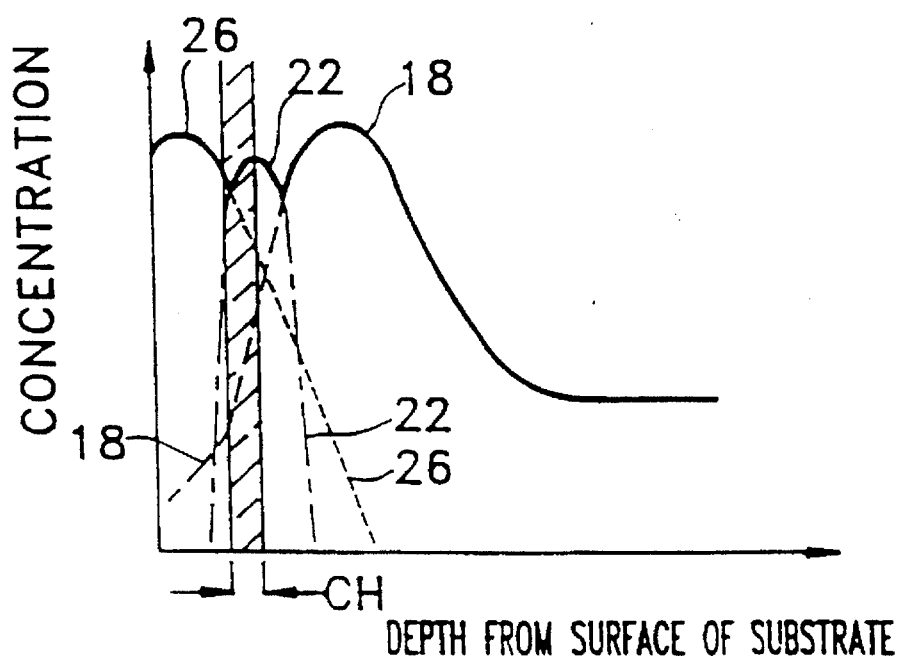
FIG. 2 is a diagram showing a cross section taken along line A—A' of FIG. 1.

Referring now to FIG. 2, N-type diffusion barrier region 22 is located between P-type threshold adjusting region 26 and N-type punchthrough prevention region 18; thus, a buried channel region "CH" is formed by a shallow P-N junction formed between P-type threshold region 26 and N-type diffusion barrier region 22.

Since N-type diffusion barrier region 22 is formed by impurity ions having a low diffusion coefficient, diffusion of P-type threshold adjusting region 26 into the bulk of the substrate is prevented. Further, since N-type punchthrough prevention region 18 is formed by impurity ions having a higher diffusion coefficient than that of diffusion barrier region 22, diffusion of N-type region 18 to the surface of the substrate is also prevented. Since this diffusion is prevented, the concentration of substrate or well ions below channel region "CH" is increased with minimal influence to the channel, and the short-channel and punchthrough characteristics are enhanced without deterioration of mobility in the channel region.

Figure 3:
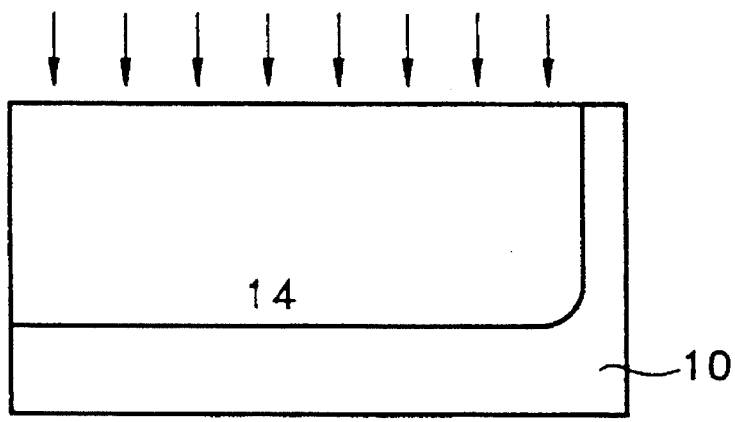
FIGS. 3 through 7 are cross-sectional views illustrating a method for manufacturing a P-channel MOS transistor according to a first embodiment of the present invention.

Referring now to FIG. 3, the step of forming N-well 14 is shown. After forming an oxide (not shown) on a P-type semiconductor substrate 10 by a thermal oxidation process, N-type impurities, e.g, phosphorous ions, are implanted in the region where a P-channel MOS transistor will be formed. N-well 14 is formed by diffusing phosphorous ions by heat treating the entire surface of the resultant structure.

Figure 4:
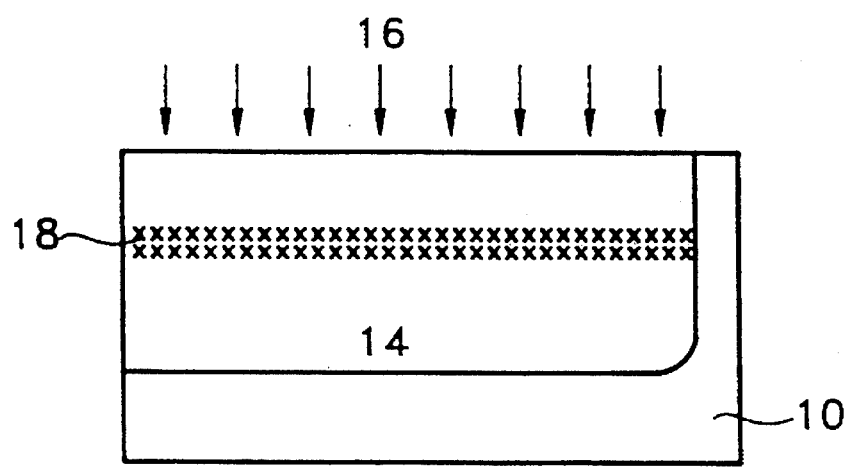

Referring now to FIG. 4, the step of forming N-type punchthrough prevention region 18 is shown. A field oxide (not shown) for isolating devices is formed on the structure of FIG. 3 to divide semiconductor substrate 10 into an isolation region and an active region. Next, a photoresist pattern (not shown) is formed on the substrate by photolithography, leaving N-well 14 exposed. Then punchthrough prevention region 18 is formed by implanting N-type impurity ions 16 having a relatively high diffusion coefficient, e.g. phosphorous ions, at a proper dose by adjusting the implantation energy so that the ions are implanted below the channel region of the P-channel MOS transistor.

Figure 5:
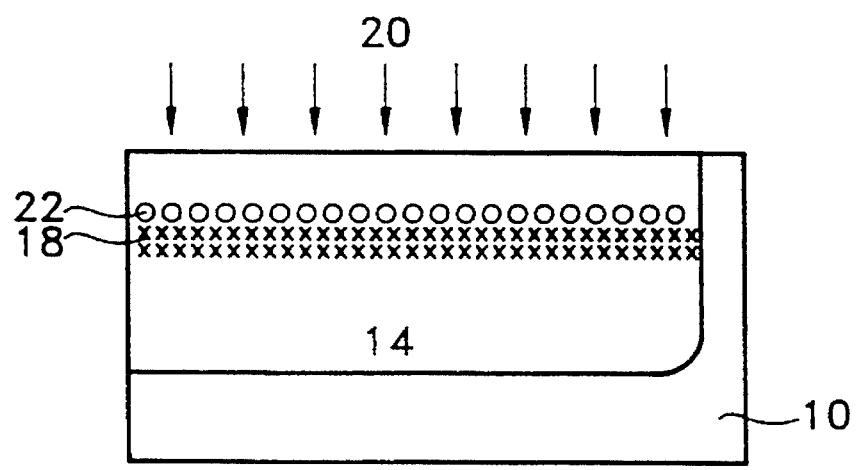

Referring now to FIG. 5, diffusion barrier region 22 is formed by implanting N-type impurity ions 20 at a low concentration into the entire surface of the resultant structure of FIG. 4. N-type impurity ions 20 have a lower coefficient than the ions of N-type punchthrough prevention region 18, e.g., arsenic, antimony, or neutral impurity ions like germanium. N-type impurity ions 20 are implanted so that the projected range thereof is shallower than the depth of N-type punchthrough region 18.

Figure 6:
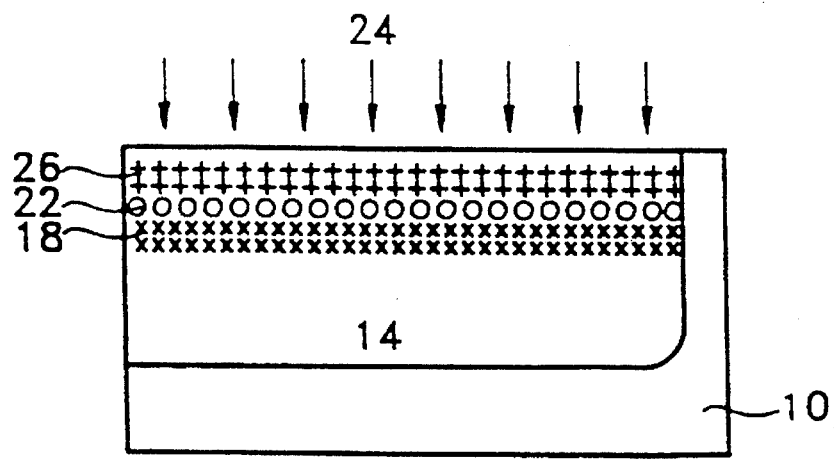

FIG. 6 shows the step of forming threshold voltage adjusting region 26. On the entire surface of the resultant structure of FIG. 5, an appropriate dose of P-type impurity ions 24, e.g, boron or $BF_2$ are implanted at a depth shallower than the depth of diffusion barrier region 22 by adjusting the implantation energy. This results in the formation of the threshold voltage adjusting region 26 of the P-channel MOS transistor.

Figure 7:
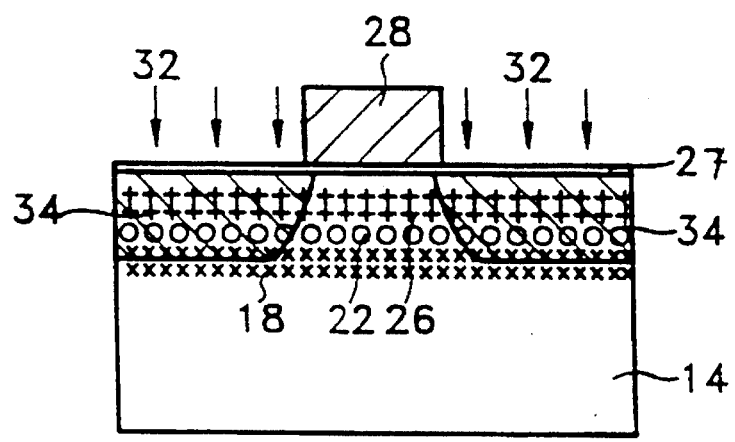

FIG. 7 shows the step of completing the P-channel MOS transistor. The photoresist pattern formed in FIG. 4 (not shown) is removed, and a thermal oxidation process is performed on the entire surface of the resultant structure, to thereby form a gate insulating film 27. Then, N-type doped polysilicon is deposited and patterned, to thereby form a gate electrode 28 on gate insulating film 27. A polycide gate composed of a silicide film and a polysilicon film may be used as gate electrode 28. Next, P+ type impurity ions 32, e.g, $BF_2$ ions are implanted at a high concentration using gate electrode 28 as a mask, to thereby form P+ source and drain regions 34 to complete the formation of the P-channel MOS transistor.

The formation of source and drain regions 34 increases the impurity concentrations of the N-type regions 18 and 22 due to the proximity of the source and drain regions 34 and the N-type impurity regions 18 and 22. However, since P-type region 26 is of the same conductivity type as the source and drain regions 34, the mid-channel portion of P-type region 26 serves to adjust the threshold voltage of the transistor, while the remainder of P-type region 26 merges into the source and drain regions 34.

After gate electrode 28 is formed as shown in FIG. 7, the following processes may be performed. An oxide may be deposited on the entire surface of the resultant structure according to a low pressure chemical vapor deposition (LPCVD) method and etched to form a spacer (not shown) on the side of gate electrode 28. Then, $BF_2$ ions may be implanted using the spacer as a mask, to form P+ source and drain region 34.

According to the first embodiment described above, diffusion barrier region 22, formed by impurity ions having a low diffusion coefficient like arsenic, suppresses the diffusion to the channel region of N-type punchthrough prevention region 18, which is formed by impurity ions having a high diffusion coefficient, such as phosphorous. Diffusion barrier region 22 also suppresses the diffusion into the bulk of the substrate of P-type threshold adjusting region 26 formed by boron or $BF_2$ ions. In this manner, mobility in the channel region is not deteriorated despite the formation of a shallow P-N junction, thereby enhancing the short-channel effect and punchthrough characteristics without reducing the current driving ability of the device.

Figure 8:
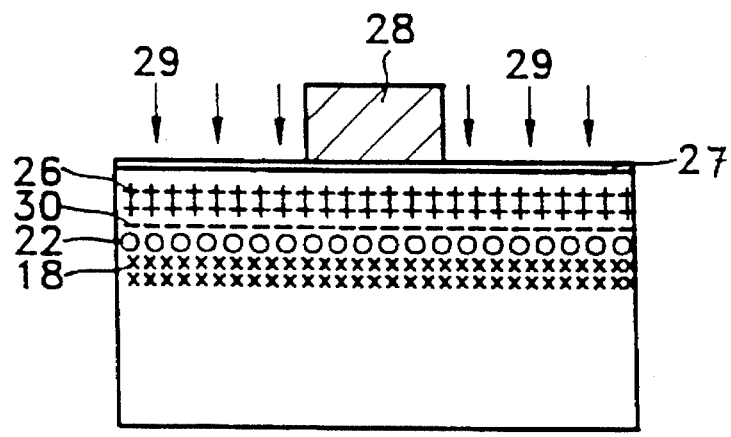
FIGS. 8 is a cross-sectional view illustrating a method for manufacturing a P-channel MOS transistor according to a second embodiment of the present invention.

FIG. 8 is a cross-sectional view illustrating a method for manufacturing a P-channel MOS transistor according to a second embodiment of the present invention. After forming gate electrode 28 by the method described with reference to FIG. 7, N-type impurity ions 29, e.g, phosphorous ions, are implanted at a low concentration using gate electrode 28 as a mask. Phosphorous ions 29 are impurity ions which form an LDD (lightly doped drain) region of an N-channel MOS transistor, and are implanted on both the N-channel MOS transistors and P-channel MOS transistors. Thus, no additional photo-mask work is necessary. Thereafter, an oxide is deposited by a LPCVD method on the entire surface of the resultant structure, and is etched to form a spacer (not shown) on the side of gate electrode 28. Then, $BF_2$ ions are implanted using the spacer as a mask, to thereby form P+ source and drain regions 34.

Figure 9:
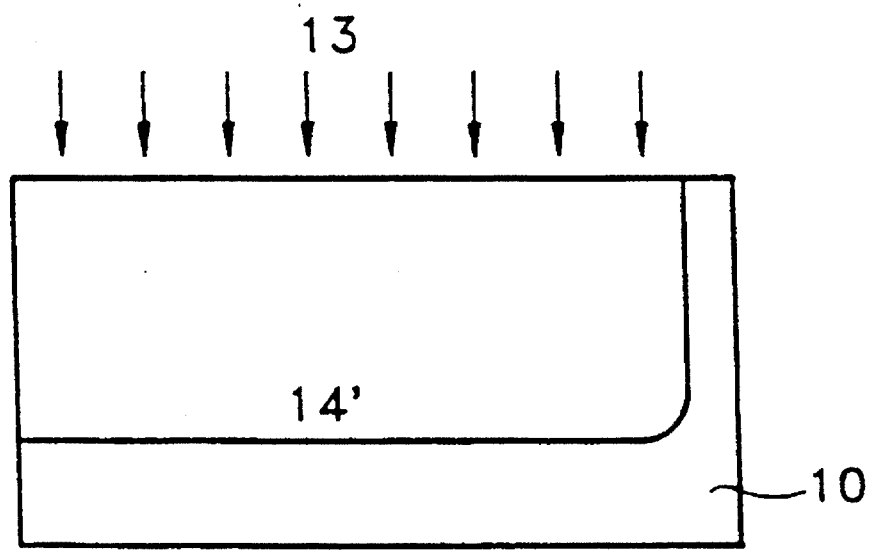
FIGS. 9 and 10 are cross-sectional views illustrating a method for manufacturing a P-channel MOS transistor according to a third embodiment of the present invention.
Figure 10:
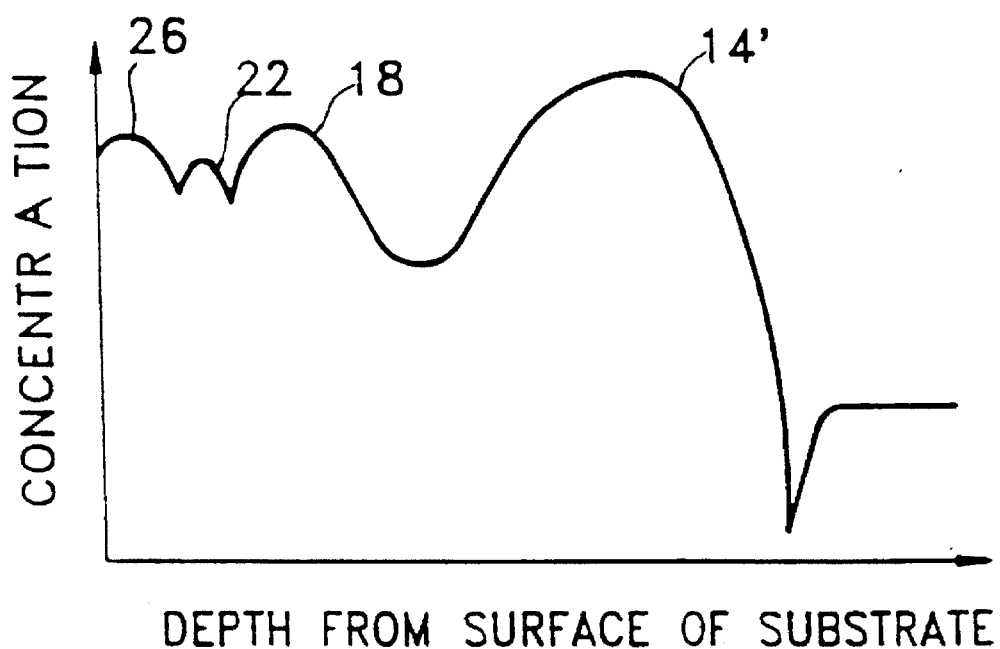

FIGS. 9 and 10 are cross-sectional views illustrating a method for manufacturing a P-channel MOS transistor according to a third embodiment of the present invention.

Referring to FIG. 9, after forming an oxide (not shown) on P-type semiconductor substrate 10 by thermal oxidation, N-type impurity ions 13, e.g, phosphorous ions, are implanted with high energy in the region where the P-channel MOS transistor will be formed, to thereby form an N-well 14' having a high concentration. This type of N-well 14' is generally called a retrograde N-well.

FIG. 10 is a diagram showing a profile of impurity concentration as a function of the depth of the substrate in the channel region of the P-channel MOS transistor. P-type threshold voltage adjusting region 26, diffusion barrier region 22, and N-type punchthrough prevention region 18 are sequentially formed in the substrate, as shown in FIG. 2. Retrograde N-well 14' having a high concentration is formed deeper into the bulk of the substrate than N-type punchthrough prevention region 18. Retrograde N-well 14' prevents a latch-up or a soft-error, etc.

Figure 11:
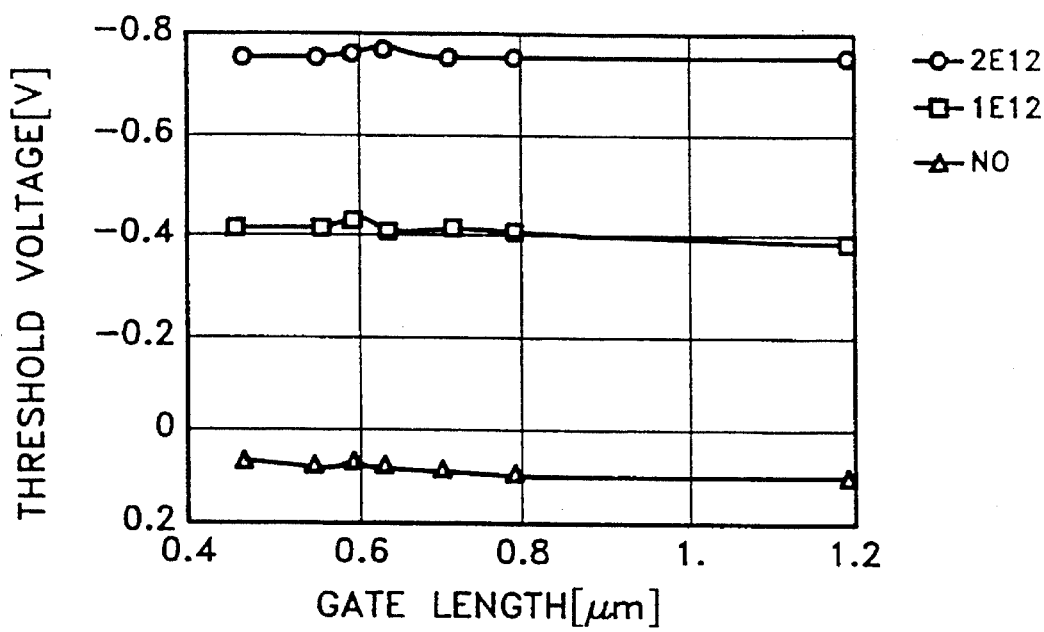
FIGS. 11 through 13 are graphs showing electrical characteristics as a function of the gate length of a P-channel MOS transistor manufactured according to the present invention.
Figure 12:
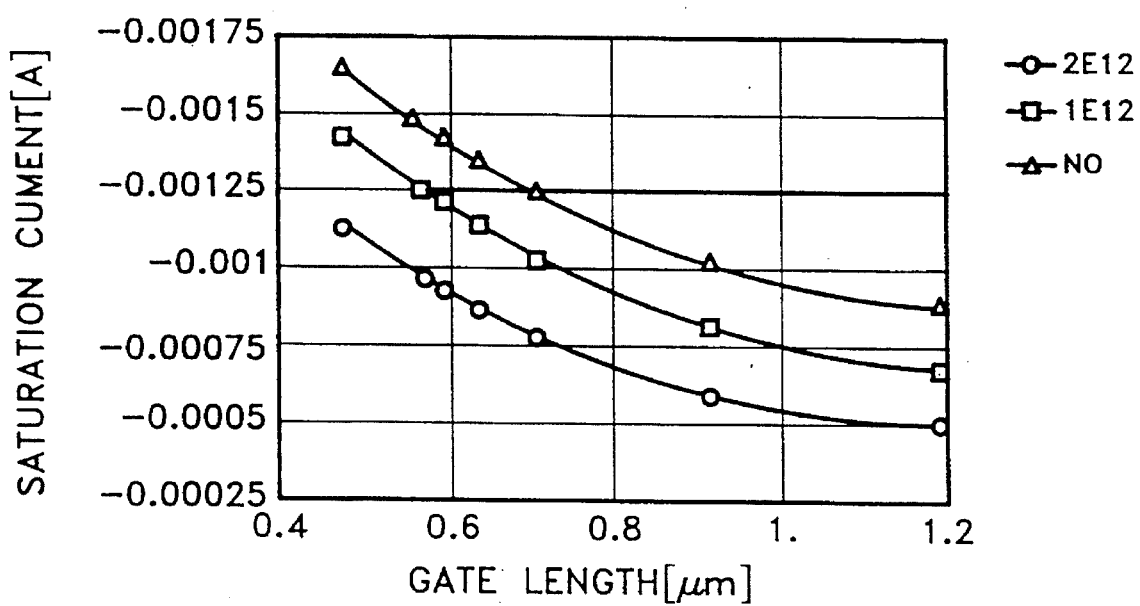
Figure 13:
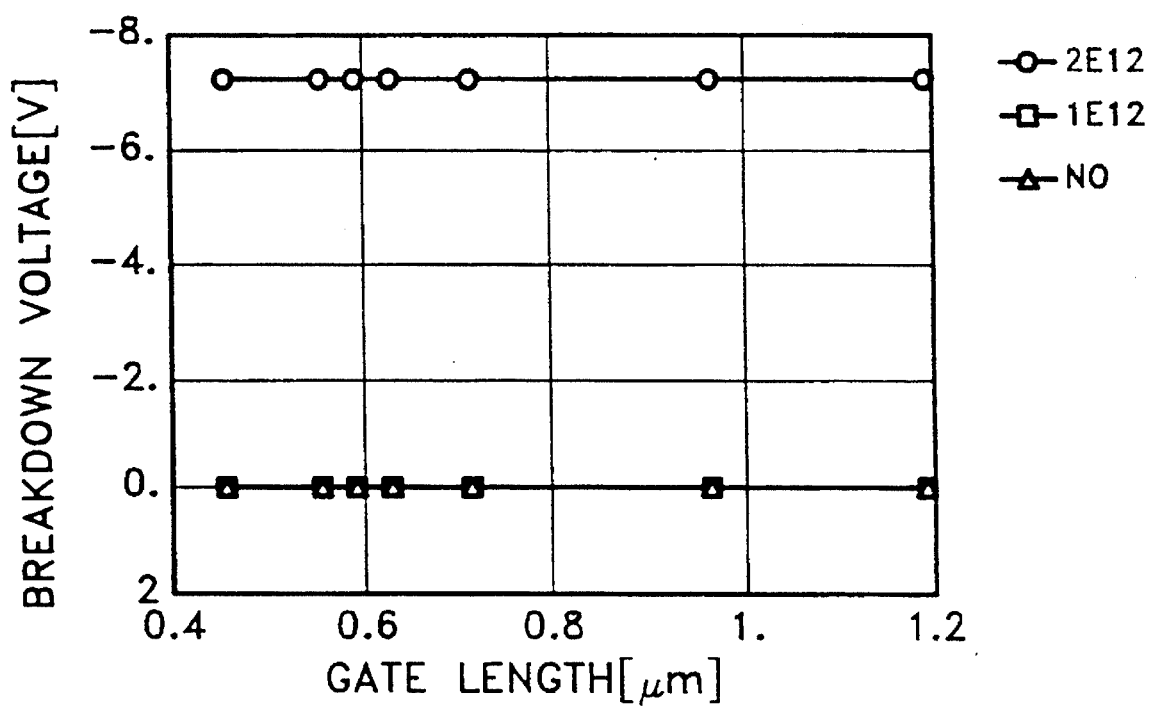

FIGS. 11 through 13 are graphs showing the electrical characteristics of threshold voltage, saturation current, and breakdown voltage, respectively, as a function of the gate length of the P-channel MOS transistor according to the present invention, where no arsenic ions are implanted, where arsenic ions implanted at a dose of $1E12/cm^2$, and where arsenic ions are implanted at a dose of $2E12/cm^2$ respectively As shown in FIGS. 11 through 13, where arsenic ion implantation is omitted ("NO") and where arsenic is implanted at the dose of $1E12/cm^2$, punchthrough occurs for long gate channels. Where arsenic ions are implanted at a dose of $2E12/cm^2$, the threshold voltage is constant at about $-0.75$ V until the gate length becomes 0.45 μm, and thus, a short-channel does not occur. Also, the saturation current is 0.1 μA per unit channel, satisfying the current driving capability required for the P-channel MOS transistor.

According to the present invention described above, after forming the punchthrough prevention region by implanting impurity ions having a high diffusion coefficient below the channel region, and after forming the diffusion barrier region by implanting impurity ions having a low diffusion coefficient at a shallower depth than the punchthrough prevention region, the threshold voltage adjusting region is formed. The diffusion barrier region prevents the diffusion of the punchthrough prevention region into the channel region, and also prevents the diffusion of the threshold voltage adjusting region in the bulk direction of the substrate. A shallow P-N junction can thus be formed without deterioration of mobility in the channel region. Accordingly, the short-channel effect and the punchthrough characteristics are enhanced without reducing the current driving ability.

It will be understood by those skilled in the art that the foregoing description is a preferred embodiment of the disclosed device and that various changes and modifications may be made in the invention without departing from the spirit and scope thereof as defined by the appended claims and their equivalents.

What is claimed is:

1. AMOS transistor, comprising:

a semiconductor substrate of a first conductivity type;

a gate insulating oxide formed on said semiconductor substrate;

a gate electrode of a first length formed on said gate insulating oxide;

a source region and a drain region formed spaced apart from each other in said semiconductor substrate, said source region and said drain region being of a second conductivity type; and impurity regions formed in said semiconductor substrate between said source region and said drain region, said impurity regions including:

a first impurity region of impurities of said first conductivity type having a first impurity concentration and being formed to a first depth in said semiconductor substrate, to prevent punchthrough, a second impurity region of impurities of said first conductivity type having a second impurity concentration and being formed on said first impurity region to a second depth in said semiconductor substrate shallower than said first depth, to serve as a diffusion barrier, and a third impurity region of impurities of said second conductivity type having a third impurity concentration and being formed on said second impurity region to a third depth in said semiconductor substrate shallower than said second depth, to adjust a threshold voltage of said MOS transistor, said first impurity concentration being ions having a first diffusion coefficient higher than a second diffusion coefficient of said second impurity concentration and a buried channel region formed between said third impurity region and said second impurity region.

2. The MOS transistor according to claim 1, wherein:

said semiconductor substrate is a well region.

3. The MOS transistor according to claim 2, wherein:

said first conductivity type is N-type; and said second conductivity type is P-type.

4. The MOS transistor according to claim 2, wherein:

said first conductivity type is P-type; and said second conductivity type is N-type.

5. A method for manufacturing a MOS transistor comprising the steps of:

implanting first impurity ions of a first conductivity type and of a first impurity concentration in a semiconductor substrate of said first conductivity type, to form a first impurity region at a first depth;

implanting second impurity ions of said first conductivity type and of a second impurity concentration and having a lower diffusion coefficient than said first impurity ions on said implanted first impurity ions, to form a second impurity region at a second depth in said semiconductor substrate shallower than said first depth;

implanting third impurity ions of a second conductivity type opposite to said first conductivity type and of a third impurity concentration on said implanted second impurity ions, to form a third impurity region at a third depth in said semiconductor substrate shallower than said second depth, thereby forming a buried channel region between said second impurity region and said third impurity region;

forming a gate insulating film on a surface of said semiconductor substrate;

forming a gate electrode on said gate insulating film; and forming a source region and a drain region by implanting fourth impurity ions of said second conductivity type in said semiconductor substrate in alignment with said gate electrode.

6. The method for manufacturing a MOS transistor according to claim 5, wherein said first impurity ions are phosphorous ions.

7. The method for manufacturing a MOS transistor of claim 5, wherein said second impurity ions are arsenic ions.

8. The method for manufacturing a MOS transistor of claim 5, wherein said second impurity ions are antimony ions.

9. The method for manufacturing a MOS transistor of claim 5, wherein said second impurity ions are germanium ions.

10. The method for manufacturing a MOS transistor of claim 5, wherein said third impurity ions are boron ions.

11. The method for manufacturing a MOS transistor of claim 5, wherein said third impurity ions are $BF_2$ ions.

12. A method for manufacturing a MOS transistor comprising the steps of:

implanting first impurity ions of a first conductivity type in a substrate, to form a well region of first conductivity type;

implanting first impurity ions of said first conductivity type in said well region, to form a first impurity region at a first depth;

implanting second impurity ions of said first conductivity type having a lower diffusion coefficient than said first impurity ions in said semiconductor substrate, to form a second impurity region at a second depth shallower than said first depth;

implanting third impurity ions of a second conductivity type opposite to said first conductivity type in said substrate, to form a third impurity region at a third depth shallower than said second depth, thereby forming a buried channel region between said second and third impurity regions;

forming a gate insulating film on the surface of said substrate;

forming a gate electrode of a first length on said gate insulating film; and forming a source region and drain region by implanting fourth impurity ions of said second conductivity type in said substrate.

13. The method for manufacturing a MOS transistor according to claim 12, wherein:

said first impurity ions are phosphorous ions;

said second impurity ions are at least one selected from a group consisting of arsenic ions, antimony ions, germanium ions, boron ions; and said third impurity ions are $BF_2$ ions.

14. A MOS transistor, comprising:

a semiconductor substrate;

a well region of a first conductivity type formed in said semiconductor substrate;

a gate insulating oxide formed on said well region of said semiconductor substrate;

a gate electrode of a first length formed on said gate insulating oxide;

a source region and a drain region formed in said well region and spaced apart from each other between said gate insulating oxide and said well region, said source region and said drain region being of a second conductivity type; and a plurality of impurity regions formed in said well region between said source region and said drain region, said plurality of impurity regions including:

a first impurity region for adjusting a threshold voltage of said MOS transistor and having impurities of a second conductivity type, a second impurity region for serving as a diffusion barrier and having impurities of said first conductivity type, and a third impurity region for preventing punchthrough and having impurities of said first conductivity type at a higher diffusion coefficient than that of said impurities of second impurity region, said first impurity region, said second impurity region, and said third impurity region being formed at sequentially shallower depths in said semiconductor substrate; and a buried channel region formed between said first impurity region and said second impurity region.

15. The MOS transistor according to claim 14, wherein:

said first conductivity type is N-type; and said second conductivity type is P-type.

16. The MOS transistor according to claim 14, wherein:

said first conductivity type is P-type; and said second conductivity type is N-type.

* * * * *